(12) United States Patent
Kwag

(10) Patent No.: US 10,854,649 B2
(45) Date of Patent: Dec. 1, 2020

(54) IMAGE SENSOR INCLUDING UNIT PIXEL BLOCK HAVING COMMON SELECTION TRANSISTOR

(71) Applicant: SK hynix Inc., Icheon-si (KR)

(72) Inventor: Pyong-Su Kwag, Eumseong-gun (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/219,049

(22) Filed: Dec. 13, 2018

(65) Prior Publication Data

US 2019/0363119 A1 Nov. 28, 2019

(51) Int. Cl.
*H01L 27/146* (2006.01)
*H04N 5/3745* (2011.01)

(52) U.S. Cl.
CPC .. *H01L 27/14609* (2013.01); *H01L 27/14605* (2013.01); *H01L 27/14643* (2013.01); *H04N 5/3745* (2013.01)

(58) Field of Classification Search
CPC ............ H01L 27/14609; H01L 27/14605
See application file for complete search history.

(56) References Cited

U.S. PATENT DOCUMENTS

| | | | | |
|---|---|---|---|---|
| 6,657,665 B1* | 12/2003 | Guidash | ............ | H01L 27/14603 257/E27.131 |
| 7,443,437 B2* | 10/2008 | Altice, Jr. | ............. | H04N 5/363 348/296 |
| 7,638,804 B2* | 12/2009 | Kido | ................. | H01L 27/14603 257/434 |
| 8,183,609 B2* | 5/2012 | Kudoh | ............. | H01L 27/14616 257/292 |
| 8,502,897 B2* | 8/2013 | Sano | ................. | H01L 27/14603 250/208.1 |
| 8,723,999 B2* | 5/2014 | Kido | ................. | H01L 27/14603 348/300 |
| 8,860,099 B2* | 10/2014 | Tatani | ............... | H01L 27/14603 257/291 |
| 8,946,611 B2* | 2/2015 | Iwata | ................. | H01L 27/14603 250/208.1 |
| 9,165,959 B2* | 10/2015 | Chen | ................. | H01L 27/14605 |
| 9,601,536 B2* | 3/2017 | Johnson | ............ | H01L 27/14603 |
| 9,773,835 B2* | 9/2017 | Kato | ................. | H01L 27/14636 |
| 10,432,831 B2* | 10/2019 | Lee | ......... | G02B 5/201 |
| 2007/0164332 A1* | 7/2007 | Paik | ................. | H01L 27/14603 257/292 |
| 2010/0225795 A1* | 9/2010 | Suzuki | ............. | H01L 27/14609 348/300 |
| 2011/0273597 A1* | 11/2011 | Ishiwata | .......... | H01L 27/14603 348/272 |

(Continued)

FOREIGN PATENT DOCUMENTS

KR 10-2019-0091801 8/2019

*Primary Examiner* — Eugene Lee
(74) *Attorney, Agent, or Firm* — Perkins Coie LLP

(57) ABSTRACT

An image sensor may include unit pixel blocks with each having pixels for sensing incident light. Each unit pixel block may include a first sub pixel block including a first floating diffusion, a second sub pixel block including a second floating diffusion, and a common transistor block including a first drive transistor adjacent to the first floating diffusion and a second drive transistor adjacent to the second floating diffusion. The first and second floating diffusions may be electrically coupled in common to the first and second drive transistors.

21 Claims, 11 Drawing Sheets

(56) References Cited

U.S. PATENT DOCUMENTS

| | | | | |
|---|---|---|---|---|
| 2013/0002915 A1* | 1/2013 | Itonaga | ............ | H01L 27/14603 348/300 |
| 2013/0049082 A1* | 2/2013 | Kato | ................... | H04N 5/3745 257/292 |
| 2013/0107087 A1* | 5/2013 | Okada | .................... | H04N 5/365 348/280 |
| 2014/0239433 A1* | 8/2014 | Wakano | .............. | H01L 27/1464 257/443 |
| 2014/0362272 A1* | 12/2014 | Ahn | ................. | H01L 27/14603 348/308 |

* cited by examiner

IMAGE SENSOR INCLUDING UNIT PIXEL BLOCK HAVING COMMON SELECTION TRANSISTOR

CROSS-REFERENCE TO RELATED APPLICATION

This patent document claims the priority and benefits of Korean Patent Application No. 10-2018-0060307 filed on May 28, 2018, which is incorporated herein by reference in its entirety.

TECHNICAL FIELD

The technology and implementations disclosed in this patent document relate to a shared pixel layout of image sensors.

BACKGROUND

Recently, the development of the information communication industry and the digitalization of electronic devices have dramatically changed the demand for image sensors with improved performance used in various fields such as digital cameras, camcorders, mobile phones, personal communication systems (PCS), game machines, security cameras and medical micro cameras. In general, an image sensor has a pixel region which includes photosensing devices such as photodiodes and a peripheral circuit region. In a unit pixel that includes a photodiode and a transfer transistor, the transfer transistor is disposed between the photodiode and a floating diffusion region, and transfers electrical charges generated in the photodiode to the floating diffusion region.

SUMMARY

This patent document provides, among others, designs of an image sensor including one or more unit pixel blocks implemented based on disclosed technology such that two drive transistors are coupled in parallel and a selection transistor is coupled in common to the two drive transistors.

Various embodiments of the disclosed technology provide an image sensor including one or more unit pixel blocks in each of which two floating diffusions are coupled in common to the gate electrodes of two drive transistors.

Various embodiments of the disclosed technology also provide an architecture of the unit pixel block that includes projecting portions and recessed portions in its two-dimensional layout to be arranged in a zigzag style.

In an embodiment, an image sensor may include unit pixel blocks with each having pixels for sensing incident light. Each unit pixel block may include a first sub pixel block including a first floating diffusion, a second sub pixel block including a second floating diffusion, and a common transistor block including a first drive transistor adjacent to the first floating diffusion and a second drive transistor adjacent to the second floating diffusion. The first and second floating diffusions may be electrically coupled in common to the first and second drive transistors.

In an embodiment, an image sensor may include an array of pixel blocks that are responsive to incident light. Each pixel block may include a first sub pixel block including a first floating diffusion, a second sub pixel block including a second floating diffusion, and a common transistor block including a first drive transistor and a second drive transistor coupled in common to the first floating diffusion and the second floating diffusion, a selection transistor coupled in common to the first drive transistor and the second drive transistor, and a reset transistor coupled in common to the first floating diffusion and the second floating diffusion.

In an embodiment, an image sensor may include unit pixel blocks. Each unit pixel block may include a first sub pixel block including first photodiodes, first transfer transistors coupled to the first photodiodes, respectively, and a first floating diffusion coupled to the first transfer transistors to receive electrical charges or signals from the first photodiodes, a second sub pixel block including second photodiodes, second transfer transistors coupled to the first photodiodes, respectively, and a second floating diffusion coupled to the second transfer transistors to receive electrical charges or signals from the second photodiodes, and a common transistor block including a first drive transistor and a second drive transistor. The first floating diffusion of the first sub pixel block and the second floating diffusion of the second sub pixel block are coupled in common to a first drive transistor of and a second drive transistor in the common transistor block.

According to the embodiments, the photoelectrons focused in floating diffusions may use both two drive transistors. Accordingly, an effect that the channel width of a drive transistor is increased may be obtained, and the current drivability of the drive transistor may be improved.

According to the embodiments, two drive transistors may be coupled in parallel. Therefore, noise immunity may be improved. Moreover, it is possible to substantially prevent an output value from varying due to a difference in the characteristics of the drive transistors.

According to the embodiments, floating diffusions and drive transistors may be arranged in a symmetrical pattern and may be coupled with one another through interconnections which have symmetrical shapes. Therefore, a mismatch phenomenon in the node capacitances of the floating diffusions may be substantially prevented or mitigated.

In an embodiment, an image sensor may include: a first sub pixel block including a first floating diffusion, a second sub pixel block including a second floating diffusion, and a common transistor block including a first drive transistor and a second drive transistor. The first drive transistor may be disposed adjacent to the first floating diffusion. The second drive transistor may be disposed adjacent to the second floating diffusion. The first and second floating diffusions and the first and second drive transistors may include a unit pixel block in which they are electrically coupled in common with one another.

In an embodiment, an image sensor may include: a first sub pixel block including a first floating diffusion, a second sub pixel block including a second floating diffusion, and a unit pixel block including a common transistor block. The common transistor block may include a first drive transistor and a second drive transistor coupled in common with the first floating diffusion and the second floating diffusion; a selection transistor coupled in common with the first drive transistor and the second drive transistor; and a reset transistor coupled in common with the first floating diffusion and the second floating diffusion.

In an embodiment, an image sensor comprising unit pixel blocks, each unit pixel block comprising: a first sub pixel block including first photodiodes, first transfer transistors coupled to the first photodiodes, respectively, and a first floating diffusion coupled to the first transfer transistors to receive electrical charges or signals from the first photodiodes; a second sub pixel block including second photodiodes, second transfer transistors coupled to the first photodiodes, respectively, and a second floating diffusion coupled to the second transfer transistors to receive electrical charges or signals from the second photodiodes; and a common transistor block including a first drive transistor and a second drive transistor. The first sub pixel block and the second sub pixel block are coupled in common to the common transistor block such that such that photoelectrons generated from the first sub pixel block and the second sub pixel block travel the same or similar distance to the common transistor block.

Other advantages according to various embodiments of the disclosed technology have been described in the text.

DETAILED DESCRIPTION

A high-performance image sensor that brings high-quality, high-resolution image may be implemented using a shared pixel structure. However, while the shared pixel structure has an advantage in that it facilitates an increase in fill factor, there is a possibility that performance characteristics may deteriorate as the area of a driving circuit including pixel transistors (e.g., reset transistor, driver transistor, and selection transistor) decreases. That is to say, while the shared pixel structure facilitates an increase in the light receiving area of a photoelectric conversion element, the performances of the pixel transistors degrade due to a decrease in the area of the pixel transistors. Additionally, deviations in the fabrication process of image sensors with the shared pixel structure may result in a characteristic dispersion. Furthermore, some image sensors with the shared pixel structure may be vulnerable to temporal noise.

In some image sensors with the shared pixel structure, performance characteristic may vary due to overlap capacitance or parasitic capacitance induced among adjacent conductive lines, pixel transistors, and unit pixels with various architectures sharing a floating diffusion.

Various embodiments of the disclosed technology may provide an image sensor with a shared pixel structure that gives users high-quality, high-resolution images while maximizing the sizes of the pixel transistors within a limited area.

Figure 1:
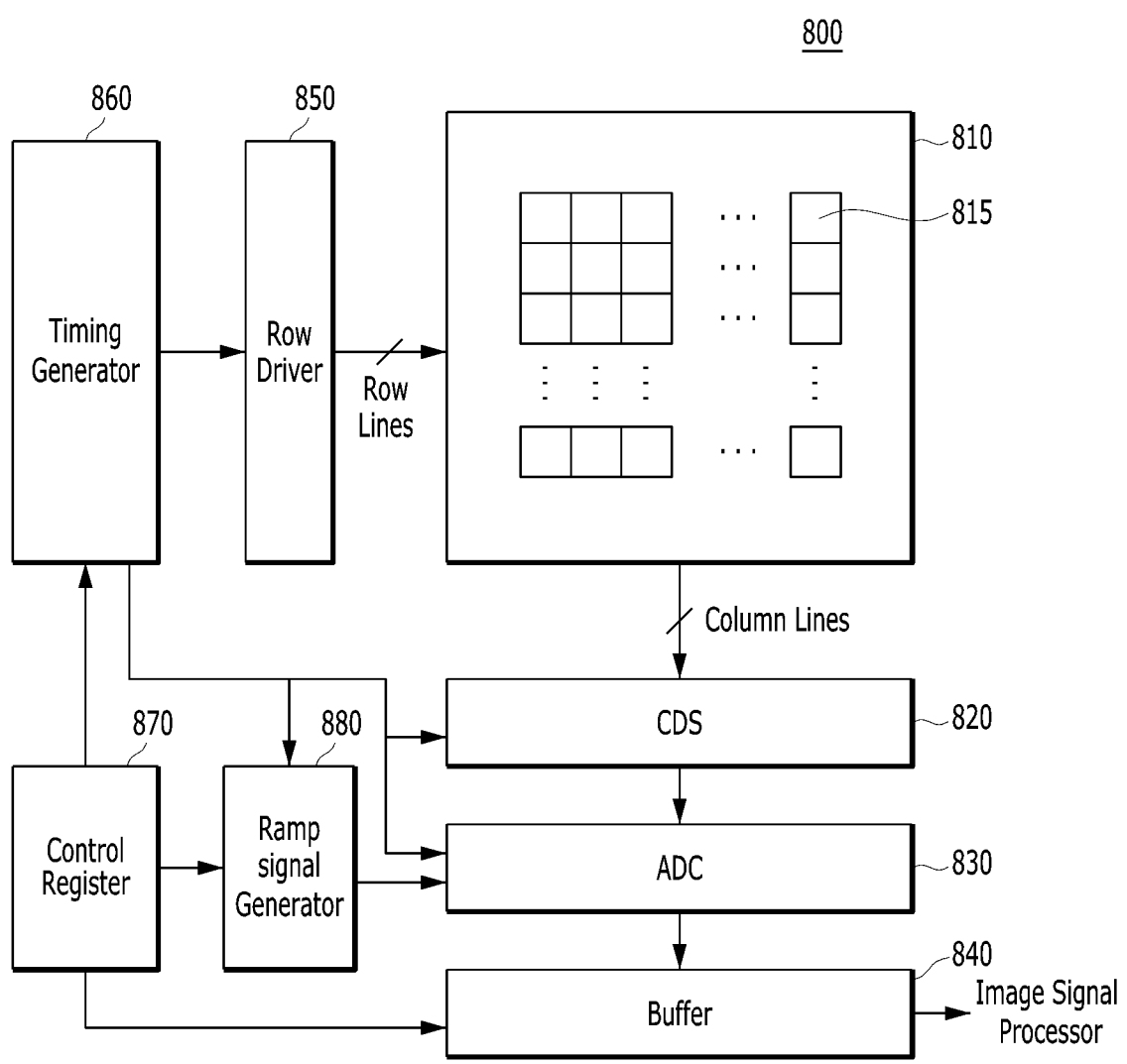
FIG. 1 is a block diagram schematically illustrating an example of an image sensor based on an embodiment of the disclosed technology.

FIG. 1 is a diagram schematically illustrating an example of an image sensor 800 based on an embodiment of the disclosed technology. Referring to FIG. 1, an image sensor 800 may include a pixel array 810 having an array of pixels responsive to incident light to produce electrical charges or signals for image sensing and circuitry for processing the electrical charges or signals. The circuitry may include a correlated double sampler (CDS) 820, an analog-to-digital converter (ADC) 830, a buffer 840, a row driver 850, a timing generator 860, a control register 870, and a ramp signal generator 880.

The pixel array 810 may include a plurality of pixel blocks 815 that are arranged in a matrix structure and each pixel block 815 includes different pixels. The pixel blocks 815 may transform optical image information (e.g., incident light photons) to electrical image signals and transmit the electrical image signals to the correlated double sampler 820 through column lines, respectively. The pixel blocks 815 may be electrically connected to one of the row lines and one of the column lines, respectively.

The correlated double sampler 820 may sample and hold the electrical image signals that are received from the pixels of the pixel array 810. For example, the correlated double sampler 820 may sample a reference voltage level and voltage levels of the received electrical image signals according to a clock signal provided by the timing generator 860, and transmit analog signals corresponding to the difference between the two voltage levels to the analog-to-digital converter 830.

The analog-to-digital converter 830 may convert the received analog signals into digital signals and transfer the digital signals to the buffer 840. The buffer 840 may store or hold (e.g., latch) the digital signals received from the analog-to-digital converter 830 and sequentially output the digital signals to an image signal processor. For example, the buffer 840 may include a memory (e.g., latch circuit) to temporarily store or hold (e.g., latch) the digital signals, and a sense amplifier to amplify the digital signals.

The row driver 850 may drive pixels of the pixel blocks 815 in the pixel array 810 according to timing signals transmitted from the timing generator 860. For example, the row driver 850 may generate selecting signals to select one of the row lines and/or driving signals to drive one of the row lines.

The timing generator 860 may generate timing signals to control the correlated double sampler 820, the analog-to-digital converter 830, the row driver 850, and the ramp signal generator 880.

The control register 870 may generate control signals to control the buffer 840, the timing generator 860, and the ramp signal generator 880.

The ramp signal generator 880 may generate a ramp signal used to convert analog signals (e.g., the electrical image signals received from the pixels) into digital signals that are to be output from the analog-to-digital convertor 830 to the buffer 840 according to the timing generator 860.

Each pixel block 815 of the image sensor 800 can include sub pixel blocks having imaging pixels with one or more photosensors or photosensing elements. Each photosensor or photosensing element converts received light into electrical charges, which may be implemented in a suitable configuration, including a photodiode, a photogate, a phototransistor, a photoconductor, or some other photosensitive structure capable of generating photo-generated electrical charges. Each imaging pixel can also include a charge storage region for storing the photo-generated charges, which may be constructed as, for example, a floating diffusion region as disclosed in the examples below. Additional circuitry may be included in each imaging pixel, e.g., a transfer transistor for transferring the photo-generated charges from the photosensor to the storage region and a reset circuitry for resetting the charges in the charge storage region after a readout.

Figure 2:
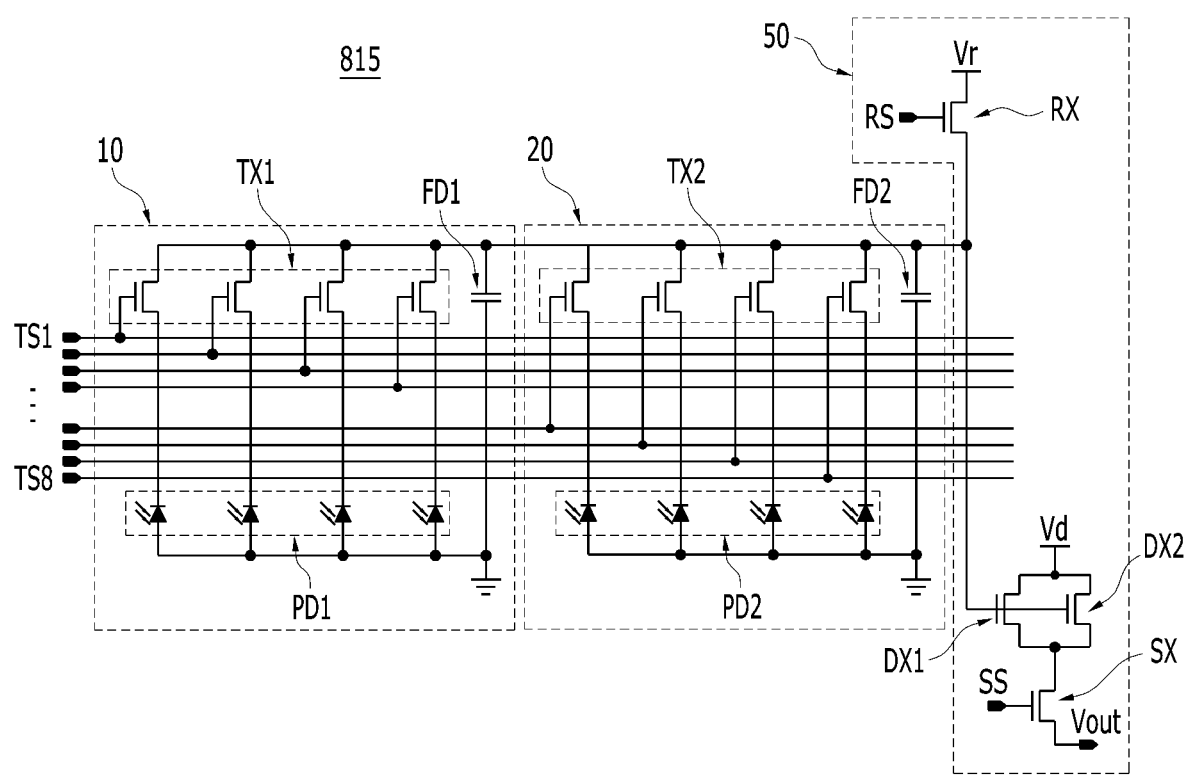
FIG. 2 is an equivalent circuit diagram of one unit pixel block of a pixel array of an image sensor implemented based on some embodiments of the disclosed technology.

FIG. 2 is a circuit diagram of one unit pixel block 815 of the pixel array 810 of the image sensor 800 implemented based on an embodiment of the disclosed technology. The unit pixel block 815 may include a first sub pixel block 10, a second sub pixel block 20, and a common transistor block 50 coupled to the first and second sub pixel blocks 10 and 20.

The first sub pixel block 10 may include a plurality of first photodiodes PD1, a plurality of first transfer transistors TX1 and a first floating diffusion FD1 structured as a first capacitor to collect the photo-generated charges from the first photodiodes PD1. The second sub pixel block 20 may include a plurality of second photodiodes PD2, a plurality of second transfer transistors TX2 and a second floating diffusion FD2 structured as a second capacitor to collect the photo-generated charges from the second photodiodes PD2. Anode electrodes of the first photodiodes PD1 may be grounded, and cathode electrodes of the first photodiodes PD1 may be electrically coupled to source electrodes of the first transfer transistors TX1. Anode electrodes of the second photodiodes PD2 may be grounded, and cathode electrodes of the second photodiodes PD2 may be electrically coupled to source electrodes of the second transfer transistors TX2. Drain electrodes of the first transfer transistors TX1 may be electrically coupled in common to the first floating diffusion FD1. Drain electrodes of the second transfer transistors TX2 may be electrically coupled in common to the second floating diffusion FD2. Under this circuity configuration, the first photodiodes PD1 may be electrically coupled in common to the first floating diffusion FD1 through the plurality of the first transfer transistors TX1, respectively, and the second photodiodes PD2 may be electrically coupled in common to the second floating diffusion FD2 through the plurality of the second transfer transistors TX2, respectively.

Each of the first photodiodes PD1 and the second photodiodes PD2 may generate photoelectrons in response to their respective incident light. The first and second photodiodes PD1 and PD2 may be photodiodes which include N-type ions and P-type ions doped into a silicon substrate. Examples of the first and second photodiodes PD1 and PD2 may include a photogate, a phototransistor, a photodiode such as a pinned photodiode, and an organic photodiode. The first transfer transistors TX1 may be turned on by first to fourth transfer signals TS1 to TS4, respectively, and transfer the photoelectrons generated by the first photodiodes PD1 to the first floating diffusion FD1. The second transfer transistors TX2 may be turned on by fifth to eighth transfer signals TS5 to TS8, respectively, and transfer the photoelectrons generated by the second photodiodes PD2 to the second floating diffusion FD2.

The common transistor block 50 may include a first drive transistor DX1, a second drive transistor DX2, a common selection transistor SX, a common output node Vout, and a common reset transistor RX. The first drive transistor DX1 and the second drive transistor DX2 may be coupled in parallel. Therefore, the first drive transistor DX1 and the second drive transistor DX2 may share the common selection transistor SX and the common reset transistor RX.

A gate electrode of the first drive transistor DX1 may be electrically coupled to the first floating diffusion FD1, and a gate electrode of the second drive transistor DX2 may be electrically coupled to the second floating diffusion FD2. First electrodes (e.g., drain electrodes) of the first drive transistor DX1 and the second drive transistor DX2 may be electrically coupled to a supply voltage node Vd. Second electrodes (e.g., source electrodes) of the first drive transistor DX1 and the second drive transistor DX2 may be electrically coupled in common to a first electrode (e.g., drain electrode) of the common selection transistor SX. A second electrode (e.g., source electrode) of the common selection transistor SX may be electrically coupled to the common output node Vout.

A first electrode (e.g., drain electrode) of the common reset transistor RX may be electrically coupled to a reset voltage node Vr. For example, the reset voltage node Vr may be the same as the supply voltage node Vd. A second electrode (e.g., source electrode) of the common reset transistor RX may be electrically coupled to the drain electrodes of the first and second transfer transistors TX1 and TX2, the first and second floating diffusions FD1 and FD2, and gate electrodes of the first and second drive transistors DX1 and DX2. Therefore, the common reset transistor RX may reset the first and second floating diffusions FD1 and FD2 to a reset voltage level.

The first floating diffusion FD1 of the first sub pixel block 10 and the second floating diffusion FD2 of the second sub pixel block 20 may be coupled in common to the gate electrodes of the first and second drive transistors DX1 and DX2. In other words, the first floating diffusion FD1 may be coupled to both the gate electrode of the first drive transistor DX1 and the gate electrode of the second drive transistor DX2, and the second floating diffusion FD2 may also be coupled to both the gate electrode of the first drive transistor DX1 and the gate electrode of the second drive transistor DX2.

The photoelectrons generated by the first photodiodes PD1 of the first sub pixel block 10 may be sequentially transferred to the first floating diffusion FD1 by the first transfer transistors TX1 which are sequentially turned on by the first to fourth transfer signals TS1 to TS4 transferred at different times, respectively. The photoelectrons generated by the second photodiodes PD2 of the second sub pixel block 20 may be sequentially transferred to the second floating diffusion FD2 by the second transfer transistors TX2 which are sequentially turned on by the fifth to eighth transfer signals TS5 to TS8 transferred at different times, respectively. Therefore, the photoelectrons generated by the first and second photodiodes PD1 and PD2 may be sequentially provided to the gate electrodes of the first and second drive transistors DX1 and DX2 so that there are time gaps between the photoelectrons being transferred from the first photodiode PD1 and the photoelectrons being transferred from the second photodiode PD2 by turning on the first and second transfer transistors TX1 and TX2 at different times. Moreover, the photoelectrons generated by the first and second photodiodes PD1 and PD2 may be sequentially provided to the common output node Vout by the common selection transistor SX.

One unit pixel block 815 may have two sub pixel blocks 10 and 20 and one common transistor block 50, and eight photodiodes PD1 and PD2, eight transfer transistors TX1 and TX2, two floating diffusions FD1 and FD2 and two drive transistors DX1 and DX2 may share one common reset transistor RX and one common selection transistor SX.

Figure 3:
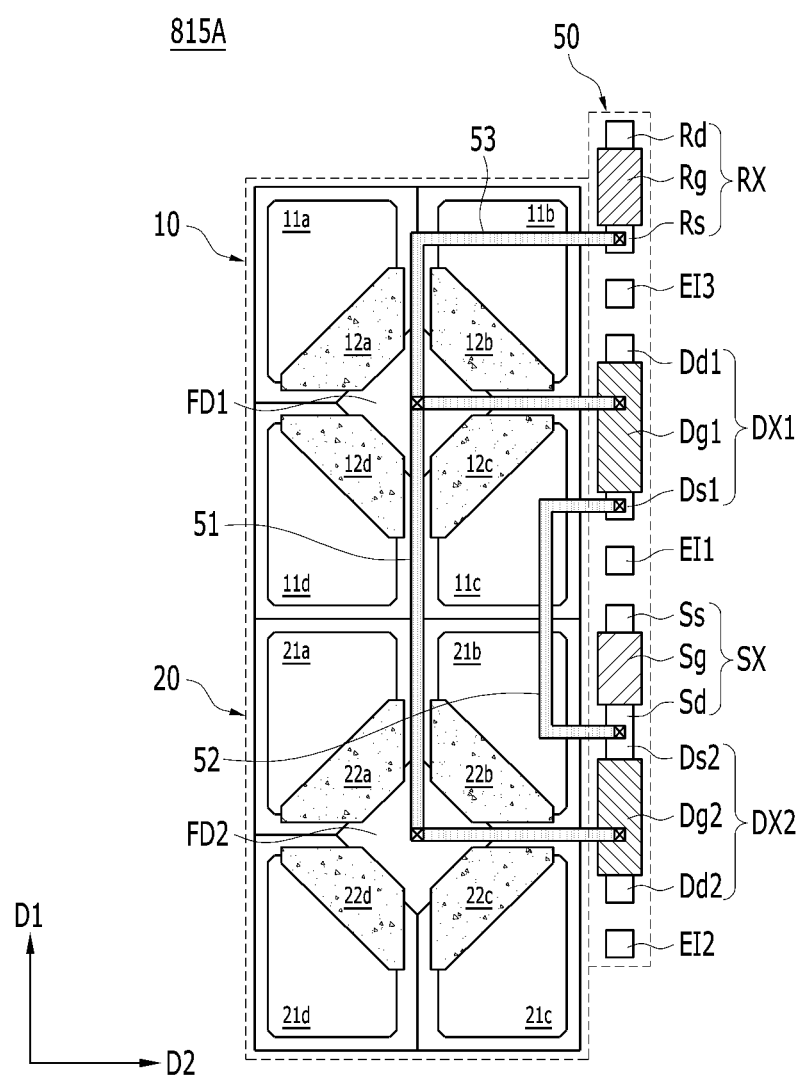
FIG. 3 is a schematic layout diagram illustrating an example of a unit pixel bock of a pixel array of an image sensor based on an embodiment of the disclosed technology.

FIG. 3 is a conceptual layout diagram illustrating an example of a unit pixel bock 815A of the pixel array 810 of the image sensor 800 based on an embodiment of the disclosed technology.

Referring to FIG. 3, the unit pixel block 815A may include a first sub pixel block 10, a second sub pixel block 20, a common transistor block 50, and interconnections 51, 52, and 53. The first sub pixel block 10 and the second sub pixel block 20 may be disposed to be adjacent to each other in a first direction D1, and the common transistor block 50 may be disposed along one side of the first sub pixel block 10 and one side of the second sub pixel block 20 in a second direction D2. The first direction D1 and the second direction D2 may be perpendicular to each other.

The first sub pixel block 10 may include first photodiodes 11a to 11d, first transfer transistors 12a to 12d, and a first floating diffusion FD1. The first photodiodes 11a to 11d and the first transfer transistors 12a to 12d may be arranged in a 2×2 matrix form. The first floating diffusion FD1 may be disposed at the center of the matrix forms which include the first photodiodes 11a to 11d and the first transfer transistors 12a to 12d arranged therein. For example, the first photodiodes 11a to 11d and the first transfer transistors 12a to 12d may be symmetrical with respect to the first floating diffusion FD1. The first transfer transistors 12a to 12d may overlap with portions of the first photodiodes 11a to 11d and portions of the first floating diffusion FD1.

The second sub pixel block 20 may include second photodiodes 21a to 21d, second transfer transistors 22a to 22d and a second floating diffusion FD2. The second photodiodes 21a to 21d and the second transfer transistors 22a to 22d may be arranged in a 2×2 matrix form. The second floating diffusion FD2 may be disposed at the center of the matrix forms which include the second photodiodes 21a to 21d and the second transfer transistors 22a to 22d arranged therein. For example, the second photodiodes 21a to 21d and the second transfer transistors 22a to 22d may be symmetrical with respect to the second floating diffusion FD2. The second transfer transistors 22a to 22d may overlap with portions of the second photodiodes 21a to 21d and portions of the second floating diffusion FD2.

The common transistor block 50 may include a first drive transistor DX1, a second drive transistor DX2, a common selection transistor SX, and a common reset transistor RX. The interconnections 51, 52, and 53 may include a first interconnection 51, a second interconnection 52, and a third interconnection 53. The first interconnection 51 may electrically couple the first floating diffusion FD1, the second floating diffusion FD2, a first gate electrode Dg1 of the first drive transistor DX1, and a second gate electrode Dg2 of the second drive transistor DX2 to each other. The second interconnection 52 may electrically couple a first source electrode Ds1 of the first drive transistor DX1, a second source electrode Ds2 of the second drive transistor DX2, and a drain electrode Sd of the common selection transistor SX to each other. The second source electrode Ds2 of the second drive transistor DX2 may be coupled to the drain electrode Sd of the common selection transistor SX. For example, the same electrode may be used as both the second source electrode Ds2 of the second drive transistor DX2 and the drain electrode Sd of the common selection transistor SX. Therefore, the first drive transistor DX1 and the second drive transistor DX2 may share the common selection transistor SX. As shown in FIG. 2, a first drain electrode Dd1 of the first drive transistor DX1 and a second drain electrode Dd2 of the second drive transistor DX2 may be electrically coupled to the supply voltage node Vd. The third interconnection 53 may couple the first and second floating diffusions FD1 and FD2 and the first and second gate electrodes Dg1 and Dg2 of the first and second drive transistors DX1 and DX2 to a source electrode Rs of the common reset transistor RX. As shown in FIG. 2, a gate electrode Rg of the common reset transistor RX may be turned on by a reset signal RS to initialize the first and second floating diffusions FD1 and FD2 to the reset voltage level.

The first drive transistor DX1 may be disposed close to the first floating diffusion FD1, and the second drive transistor DX2 may be disposed close to the second floating diffusion FD2. For example, the first drive transistor DX1 and the first floating diffusion FD1 may be disposed such that an interconnection extending in the second direction D2 can connect the first drive transistor DX1 to the first floating diffusion FD1, and the second drive transistor DX2 and the second floating diffusion FD2 may be disposed such that an interconnection extending in the second direction D2 can connect the second drive transistor DX2 to the second floating diffusion FD2. Therefore, the length of a path of the first interconnection 51 which couples the first floating diffusion FD1 to the first drive transistor DX1 may be similar or identical to the length of a path of the first interconnection 51 which couples the second floating diffusion FD2 to the second drive transistor DX2.

The first drive transistor DX1 and the second drive transistor DX2 may have line symmetry (e.g., symmetrical about a line between the first drive transistor DX1 and the second drive transistor DX2). The first sub pixel block 10 and the second sub pixel block 20 may be arranged in the same way. In an implementation of the disclosed technology, the first sub pixel block 10, the first drive transistor DX1 and the upper portion of the first interconnection 51 may be vertically symmetrical to the second sub pixel block 20, the second drive transistor DX2 and the lower portion of the first interconnection 51, respectively. When the photoelectrons transferred from the first photodiodes FD1 to the first floating diffusion FD1 of the first sub pixel block 10 and the photoelectrons transferred from the second photodiodes FD2 to the second floating diffusion FD2 of the second sub pixel block 20 are transferred to the gate electrodes Dg1 and Dg2 of the first and second drive transistors DX1 and DX2, those photoelectrons travel the same or similar distance. Also, the photoelectrons generated by the first and second photodiodes 11a to 11d and 21a to 21d and transferred through the first and second floating diffusions FD1 and FD2 of the first and second sub pixel blocks 10 and 20 may use both the first and second drive transistors DX1 and DX2. That is to say, a channel width can be doubled by allowing the photoelectrons transferred from one of the sub pixel blocks 10 and 20 may simultaneously turn on the two drive transistors DX1 and DX2.

The common transistor block 50 may further include electrical isolation regions EI1 to EI3. The first electrical isolation region EI1 may be disposed between the first drive transistor DX1 and the common selection transistor SX. The first electrical isolation region EI1 may prevent the first drive transistor DX1 and the common selection transistor SX from influencing each other. The second electrical isolation region EI2 may be disposed between the second drive transistor DX2 and the common reset transistor RX of another adjacent unit pixel block. The second electrical isolation region EI2 may prevent the second drive transistor DX2 and the common reset transistor RX of another adjacent unit pixel block from influencing each other. The third electrical isolation region EI3 may be disposed between the first drive transistor DX1 and the common reset transistor RX. The third electrical isolation region EI3 may prevent the first drive transistor DX1 and the common reset transistor RX from influencing each other. Therefore, the first electrical isolation region EI1 and the second electrical isolation region EI2 may protect the second drive transistor DX2 and the common selection transistor SX from external electrical influences, and the first electrical isolation region EI1 and the third electrical isolation region EI3 may protect the first drive transistor DX1 from external electrical influences. The second electrical isolation region EI2 and the third electrical isolation region EI3 may protect the common reset transistor RX from external electrical influences. For example, the first to third electrical isolation regions EI1 to EI3 may be active regions to which a ground voltage is applied. In an embodiment of the disclosed technology, the first to third electrical isolation regions EI1 to EI3 may be portions of a substrate that is exposed and has a conductivity.

Since the unit pixel block 815A of the image sensor 800 implemented based on some embodiments of the disclosed technology includes the electrical isolation regions EI1 to EI3 which are disposed between the pixel transistors DX1, DX2, SX, and RX, a signal interference between the pixel transistors DX1, DX2, SX, and RX may be mitigated, minimized, and/or eliminated.

In some embodiments of the disclosed technology, even though the amounts of the photoelectrons in the first floating diffusion FD1 of the first sub pixel block 10 and the second floating diffusion FD2 of the second sub pixel block 20 are small, these weak signals may be amplified by the two drive transistors DX1 and DX2. Accordingly, a small-sized unit pixel block 815A may provide high-resolution images.

Figure 4:
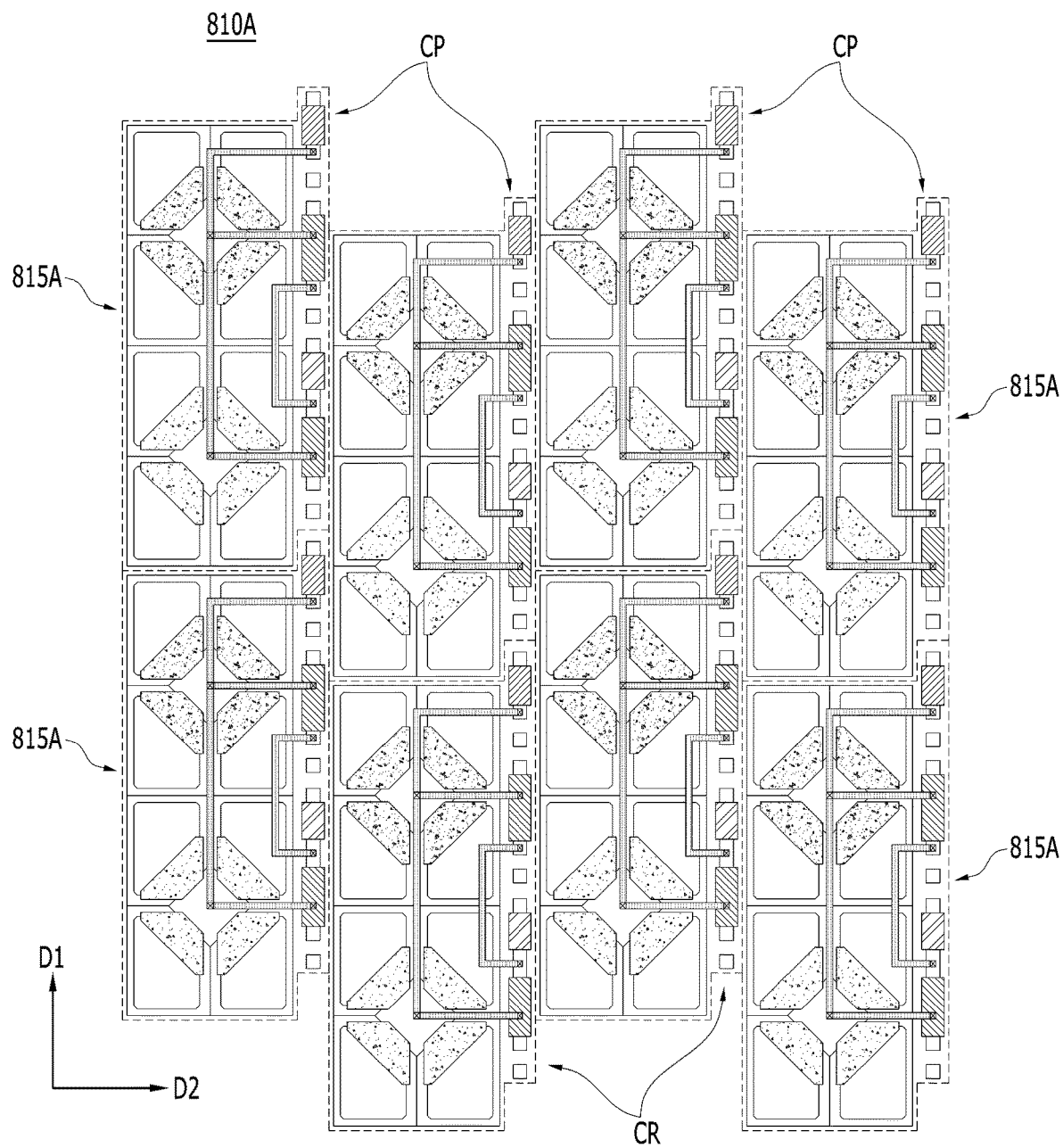
FIG. 4 is a layout diagram schematically illustrating an example of the pixel array of the image sensor based on some embodiments of the disclosed technology.

FIG. 4 is a layout diagram schematically illustrating an example of a pixel array 810A of the image sensor 800 based on some embodiments of the disclosed technology. Referring to FIG. 4, the pixel array 810A may include a plurality of unit pixel blocks 815A arranged side by side in the first direction D1 and are arranged in a zigzag style in the second direction D2. As shown in FIG. 3, the unit pixel blocks 815A may be arranged such that projecting portions CP and recessed portions CR of common transistor blocks 50 are engaged with each other. Each of the projecting portions CP may include a portion where the common reset transistor RX is formed in the common transistor block 50, and each of the recessed portions CR may be located outside the second drive transistor DX2 formed in the common transistor block 50.

Figure 5:
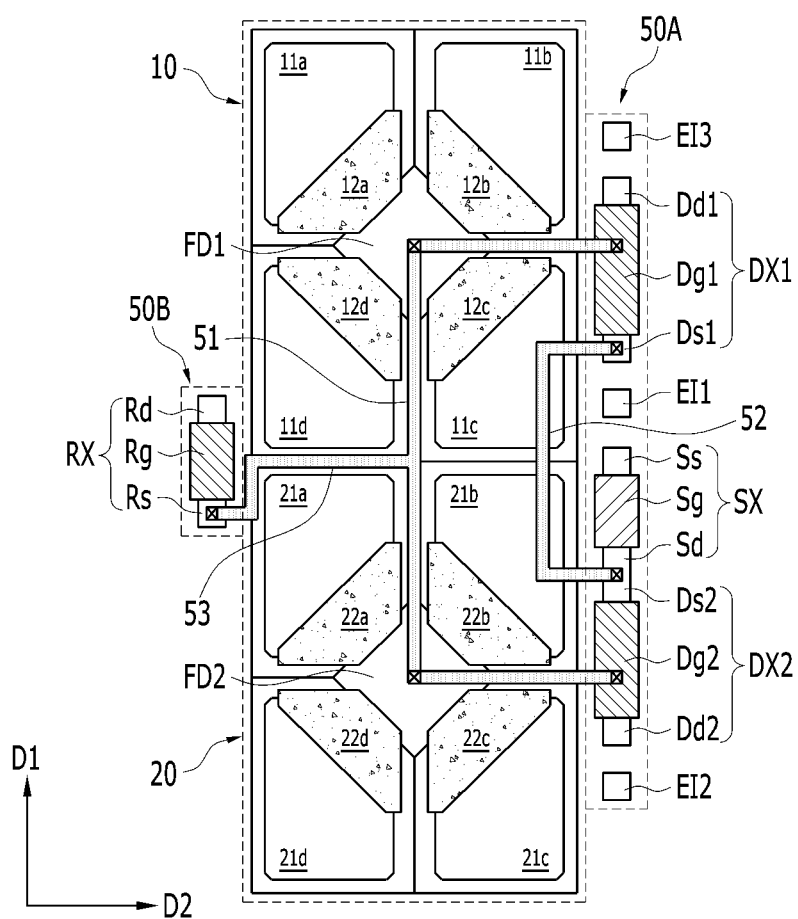
FIG. 5 is a schematic layout diagram illustrating an example of a unit pixel bock of a pixel array of an image sensor based on another embodiment of the disclosed technology.

FIG. 5 is a conceptual layout diagram illustrating an example of a unit pixel bock 815B of the pixel array 810 of the image sensor 800 based on another embodiment of the disclosed technology. Referring to FIG. 5, the unit pixel block 815B may include a first sub pixel block 10, a second sub pixel block 20, a first common transistor block 50A, a second common transistor block 50B, and interconnections 51, 52, and 53. The first sub pixel block 10 and the second sub pixel block 20 may be disposed to be adjacent to each other in a first direction D1, the first common transistor block 50A may be disposed to be adjacent to first sides of the first sub pixel block 10 and the second sub pixel block 20 in a second direction D2, and the second common transistor block 50B may be disposed to be adjacent to second sides of the first sub pixel block 10 and the second sub pixel block 20 in the second direction D2. Here, the second sides face away from the first sides. The first direction D1 and the second direction D2 may be perpendicular to each other. The first sub pixel block 10 and the second sub pixel block 20 may be understood by referring to the unit pixel block 815A shown in FIG. 3.

The first common transistor block 50A may include a first drive transistor DX1, a second drive transistor DX2 and a common selection transistor SX. As shown in FIG. 3, the first floating diffusion FD1 of the first sub pixel block 10, the second floating diffusion FD2 of the second sub pixel block 20, the first drive transistor DX1 and the second drive transistor DX2 may be electrically coupled to each other by the first interconnection 51. The first sub pixel block 10 and the second sub pixel block 20 may have the same or similar layout. For example, the first sub pixel block 10 and the second sub pixel block 20 may have line symmetry (e.g., symmetrical about a line between the first sub pixel block 10 and the second sub pixel block 20). Additionally, the first drive transistor DX1 and the second drive transistor DX2 may have line symmetry (e.g., symmetrical about a line between the first drive transistor DX1 and the second drive transistor DX2). The second interconnection 52 may electrically couple the first source electrode Ds1 of the first drive transistor DX1 and the second source electrode Ds2 of the second drive transistor DX2 to the drain electrode Sd of the common selection transistor SX.

The second common transistor block 50B may be disposed to be adjacent to the boundary between the first sub pixel block 10 and the second sub pixel block 20. The second common transistor block 50B may include a common reset transistor RX. The third interconnection 53 may electrically couple the first interconnection 51 to the source electrode Rs of the common reset transistor RX. The third interconnection 53 may be electrically coupled to the first interconnection 51 such that photoelectrons from the first sub pixel block 10 and the second sub pixel block 20 travel the same or similar distance. For example, a first portion of the first interconnection 51 couples the third interconnection 53 to the first drive transistor DX1 and the first floating diffusion FD1, and a second portion of the first interconnection 51 couples the third interconnection 53 to the second drive transistor DX2 and the second floating diffusion FD2, where a length of the first portion of the first interconnection 51 is similar or identical to a length of the second portion of the first interconnection 51. Thus, the common reset transistor RX may simultaneously reset the first floating diffusion FD1 of the first sub pixel block 10 and the second floating diffusion FD2 of the second sub pixel block 20 without any difference in reset time.

The first common transistor block 50A may further include electrical isolation regions EI1 to EI3. The first electrical isolation region EI1 may be disposed between the first drive transistor DX1 and the common selection transistor SX. The second electrical isolation region EI2 may be disposed between the second drive transistor DX2 and the common reset transistor RX of another adjacent unit pixel block. The third electrical isolation region EI3 may be disposed between the first drive transistor DX1 and the common reset transistor RX of another adjacent unit pixel block. Therefore, the first to third electrical isolation regions EI1 to EI3 may protect the first and second drive transistors DX1 and DX2 from external electrical influences.

Figure 6:
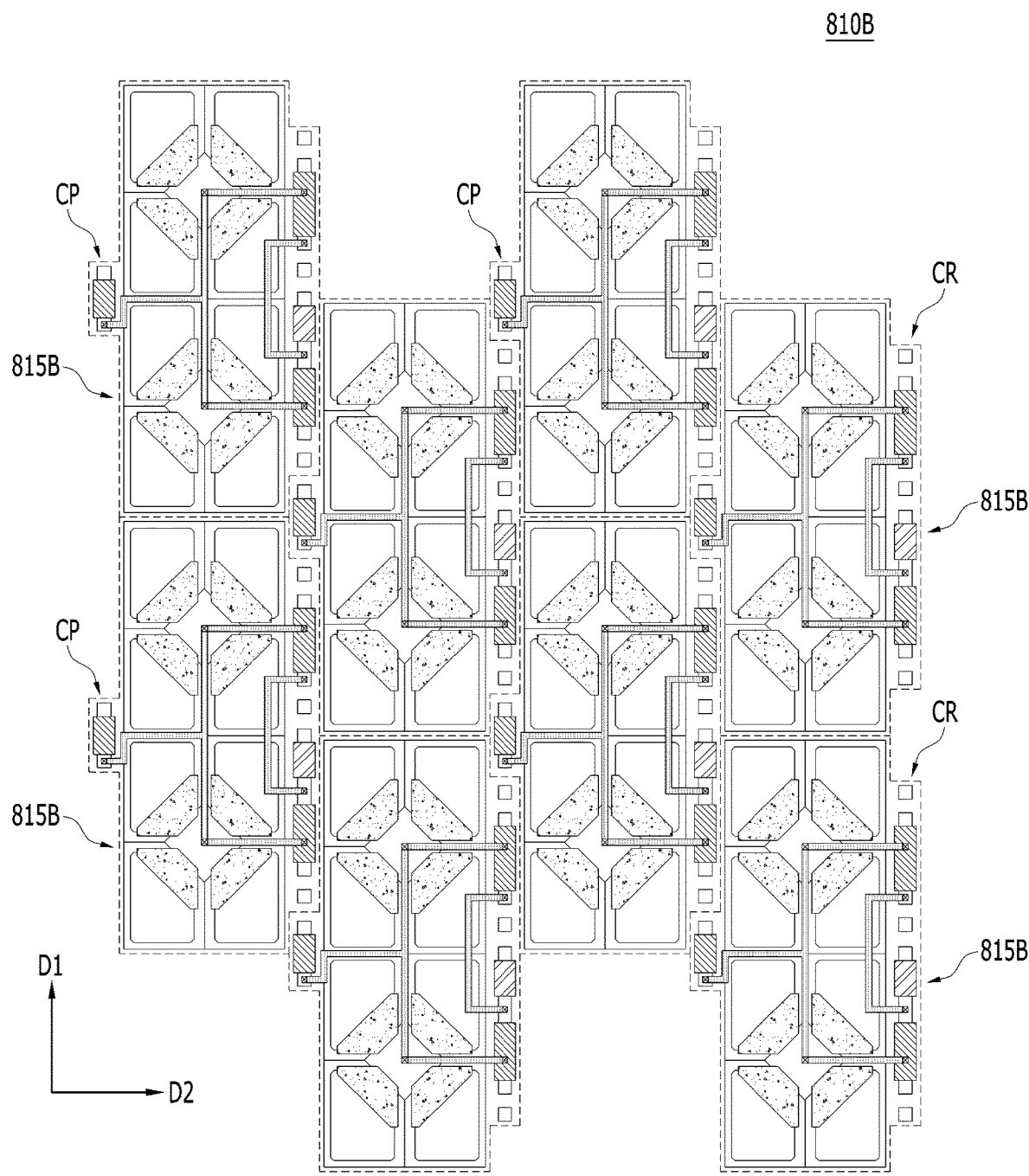
FIG. 6 is a layout diagram schematically illustrating an example of the pixel array of the image sensor based on some embodiments of the disclosed technology.

FIG. 6 is a layout diagram schematically illustrating an example of a pixel array 810B of the image sensor 800 based on some embodiments of the disclosed technology. Referring to FIG. 6, the pixel array 810B may include a plurality of unit pixel blocks 815B arranged side by side in the first direction D1 and are arranged in a zigzag style in the second direction D2. As shown in FIG. 5, the unit pixel blocks 815B may be arranged two-dimensionally such that recessed portions CR between first common transistor blocks 50A and projecting portions CP of second common transistor blocks 50B are engaged with each other. The projecting portions CP may include portions where second common transistor blocks 50B, that is, common reset transistors RX, are formed, and the recessed portions CR may be located outside the first common transistor blocks 50A including regions over and under the first common transistor blocks 50A.

Figure 7:
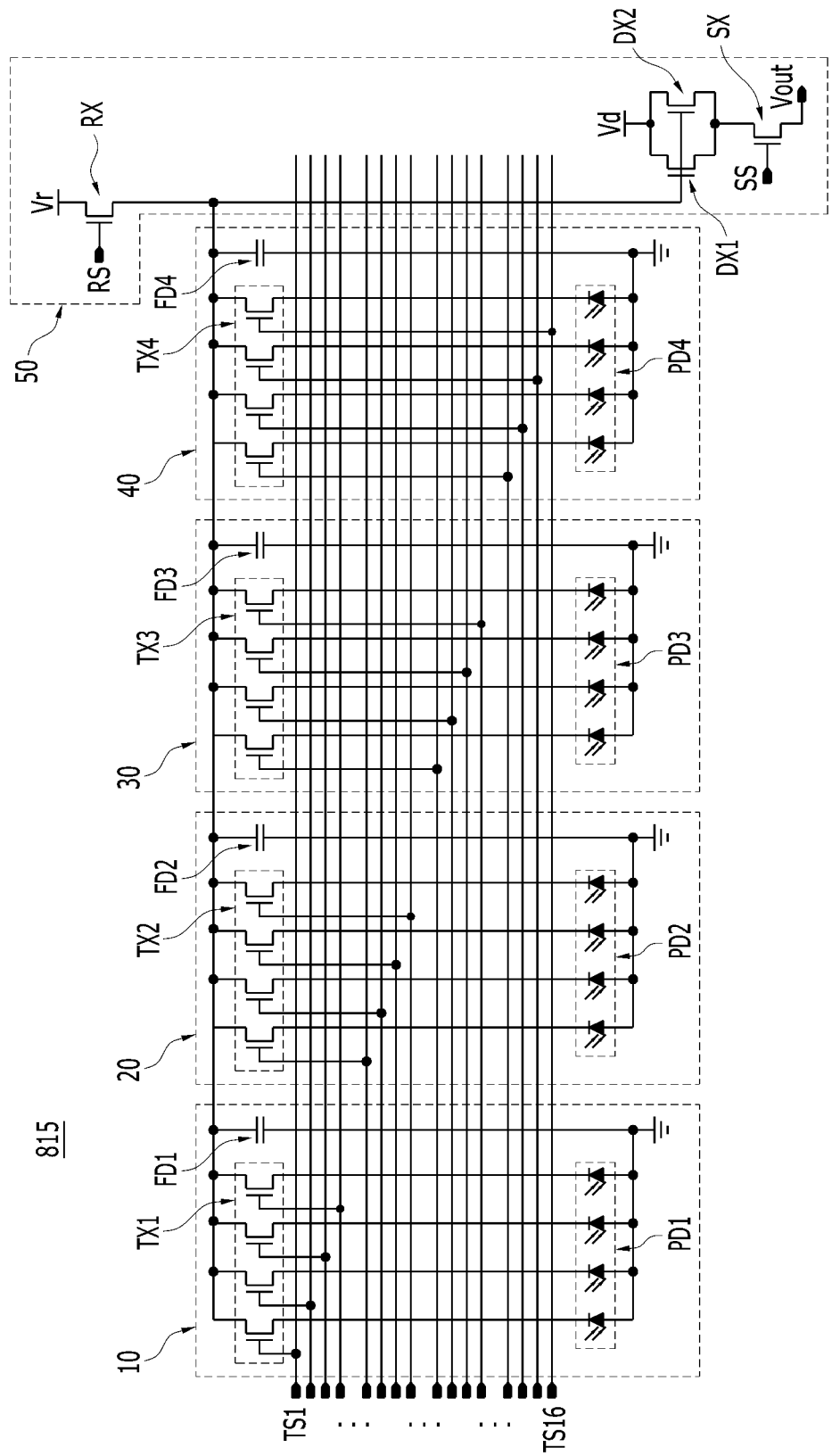
FIG. 7 is an equivalent circuit diagram of one unit pixel block of a pixel array of an image sensor implemented based on some embodiments of the disclosed technology.

FIG. 7 is an equivalent circuit diagram of one unit pixel block 815 of the pixel array 810 of the image sensor 800 implemented based on some embodiments of the disclosed technology. Referring to FIG. 7, the unit pixel block 815 may include a first sub pixel block 10, a second sub pixel block 20, a third sub pixel block 30, a fourth sub pixel block 40, and a common transistor block 50.

The first sub pixel block 10 may include a plurality of first photodiodes PD1, a plurality of first transfer transistors TX1 and a first floating diffusion FD1 structured as a first capacitor. The second sub pixel block 20 may include a plurality of second photodiodes PD2, a plurality of second transfer transistors TX2 and a second floating diffusion FD2 structured as a second capacitor. The third sub pixel block 30 may include a plurality of third photodiodes PD3, a plurality of third transfer transistors TX3, and a third floating diffusion FD3 structured as a third capacitor. The fourth sub pixel block 40 may include a plurality of fourth photodiodes PD4, a plurality of fourth transfer transistors TX4, and a fourth floating diffusion FD4 structured as a fourth capacitor. The common transistor block 50 may include a first drive transistor DX1, a second drive transistor DX2, a common selection transistor SX, a common output node Vout, and a common reset transistor RX. In the unit pixel block 815 implemented based on some embodiments of the disclosed technology, 16 photodiodes PD1, PD2, PD3, and PD4 may share one common transistor block 50. The unit pixel block 815 may be understood by additionally referring to FIG. 2.

Figure 8A:
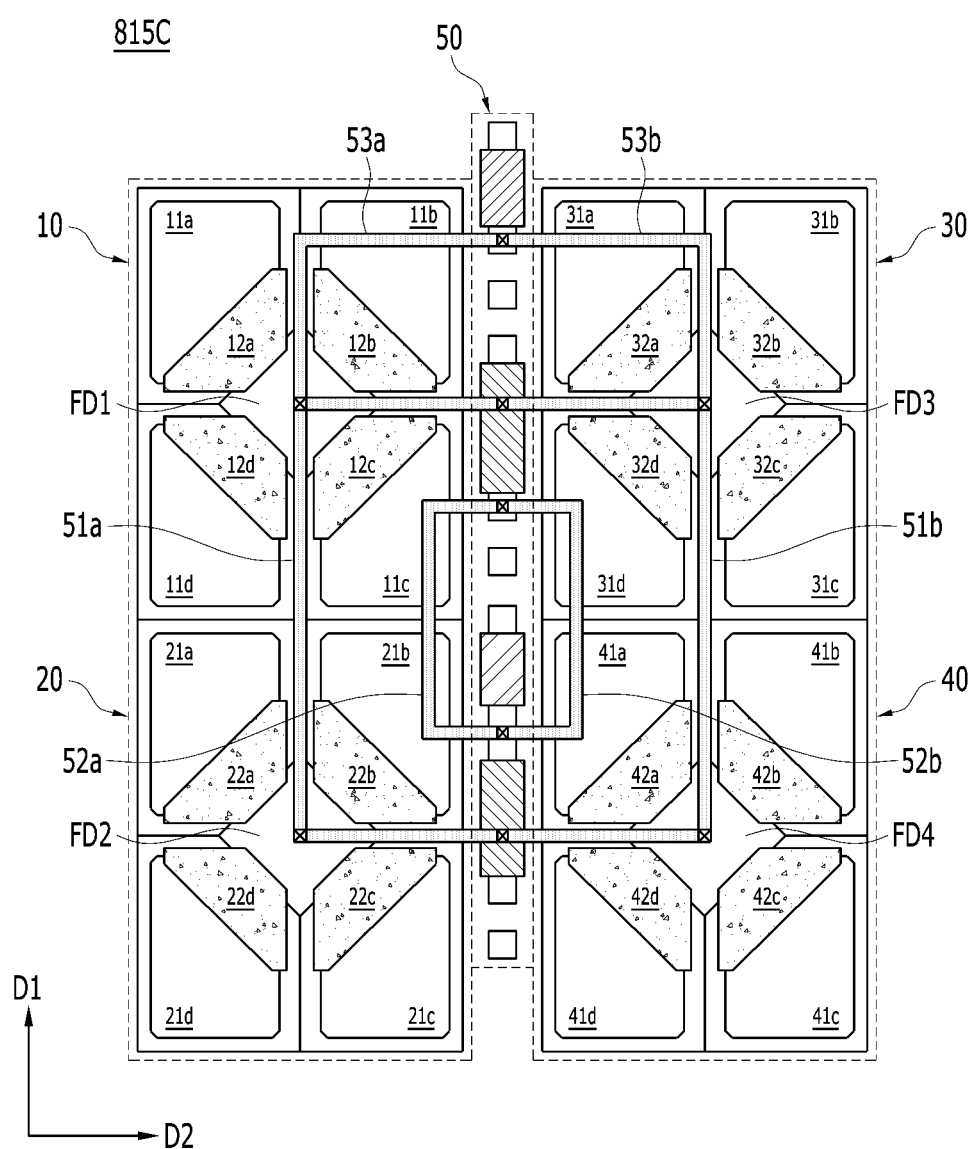
FIG. 8A is a schematic layout diagram illustrating an example of a unit pixel bock of a pixel block of an image sensor based on an embodiment of the disclosed technology.

FIG. 8A is a conceptual layout diagram illustrating an example of a unit pixel bock 815C of the pixel array 810 of the image sensor 800 based on an embodiment of the disclosed technology. Referring to FIG. 8A, the unit pixel block 815C may include first to fourth sub pixel blocks 10 to 40 which are disposed in a 2×2 matrix form, a common transistor block 50 among the first to fourth sub pixel blocks 10 to 40, and interconnections 51a, 51b, 52a, 52b, 53a, and 53b. The first to fourth sub pixel blocks 10 to 40 may include first to fourth photodiodes 11a to 11d, 21a to 21d, 31a to 31d, and 41a to 41d, and first to fourth transfer transistors 12a to 12d, 22a to 22d, 32a to 32d, and 42a to 42d which are respectively disposed in a 2×2 matrix form. The first to fourth sub pixel blocks 10 to 40 may have the same or similar layout. For example, the first to fourth sub pixel blocks 10 to 40 may be symmetrical about a point.

Figure 8B:
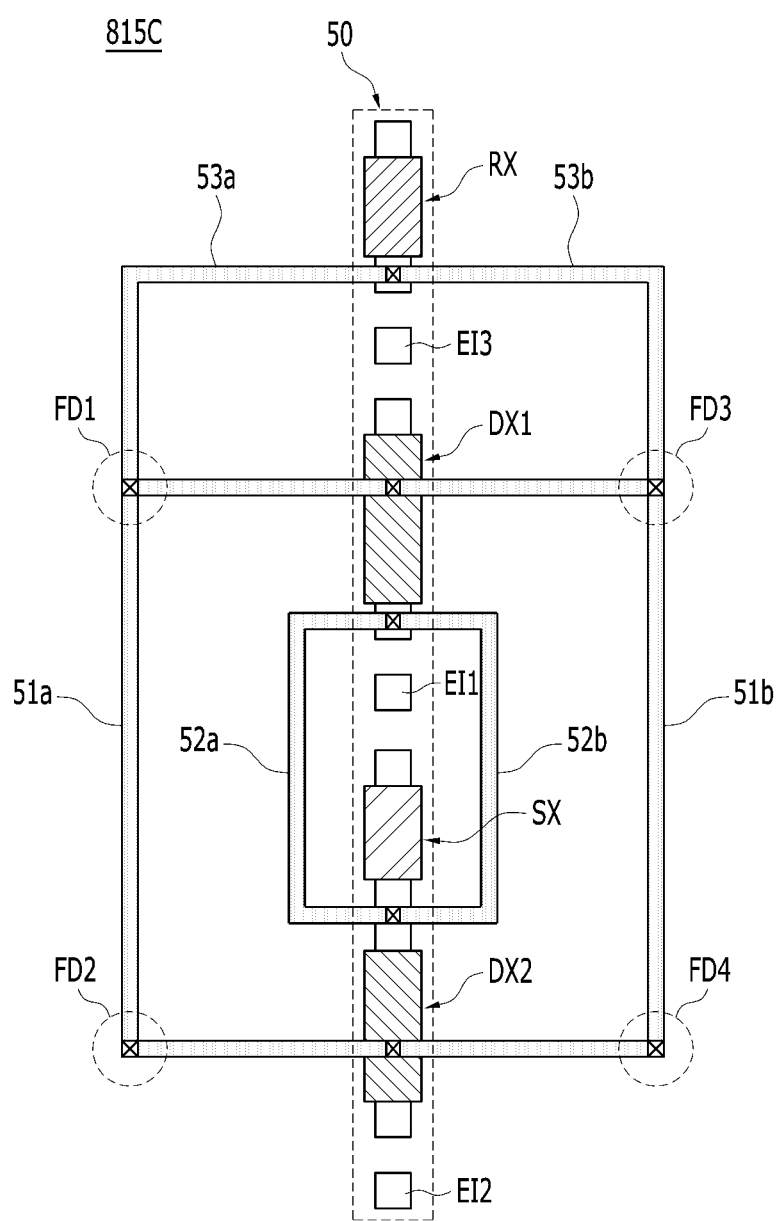
FIG. 8B is a diagram illustrating an example of a common transistor block and interconnections of the unit pixel block.

FIG. 8B is a diagram illustrating an example of the common transistor block 50 and the interconnections 51a, 51b, 52a, 52b, 53a, and 53b of the unit pixel block 815C. Referring to FIG. 8B, the common transistor block 50 may include a first drive transistor DX1, a second drive transistor DX2, a common selection transistor SX, a common reset transistor RX, and electrical isolation regions EI1 to EI3.

The first interconnections 51a and 51b may electrically couple first to fourth floating diffusions FD1 to FD4 to the gate electrodes of the first and second drive transistors DX1 and DX2. For example, the first interconnection 51a may directly connect the first and second floating diffusions FD1 and FD2 to the first and second drive transistors DX1 and DX2, and the first interconnection 51b may directly connect the third and fourth floating diffusions FD3 and FD4 and the first and second drive transistors DX1 and DX2. The first interconnections 51a and 51b may be symmetrical to each other.

The second interconnections 52a and 52b may electrically couple the drain electrode of the first drive transistor DX1 to the drain electrode of the second drive transistor DX2. The second interconnections 52a and 52b may be symmetrical to each other. Any one of the second interconnections 52a and 52b may be omitted.

The third interconnections 53a and 53b may electrically couple the first to fourth floating diffusions FD1 to FD4 to the common reset transistor RX. For example, the third interconnection 53a may electrically couple the first and second floating diffusions FD1 and FD2 to the source electrode of the common reset transistor RX, and the third interconnection 53b may electrically couple the third and fourth floating diffusions FD3 and FD4 to the source electrode of the common reset transistor RX. The third interconnections 53a and 53b may be symmetrical to each other.

Figure 9:
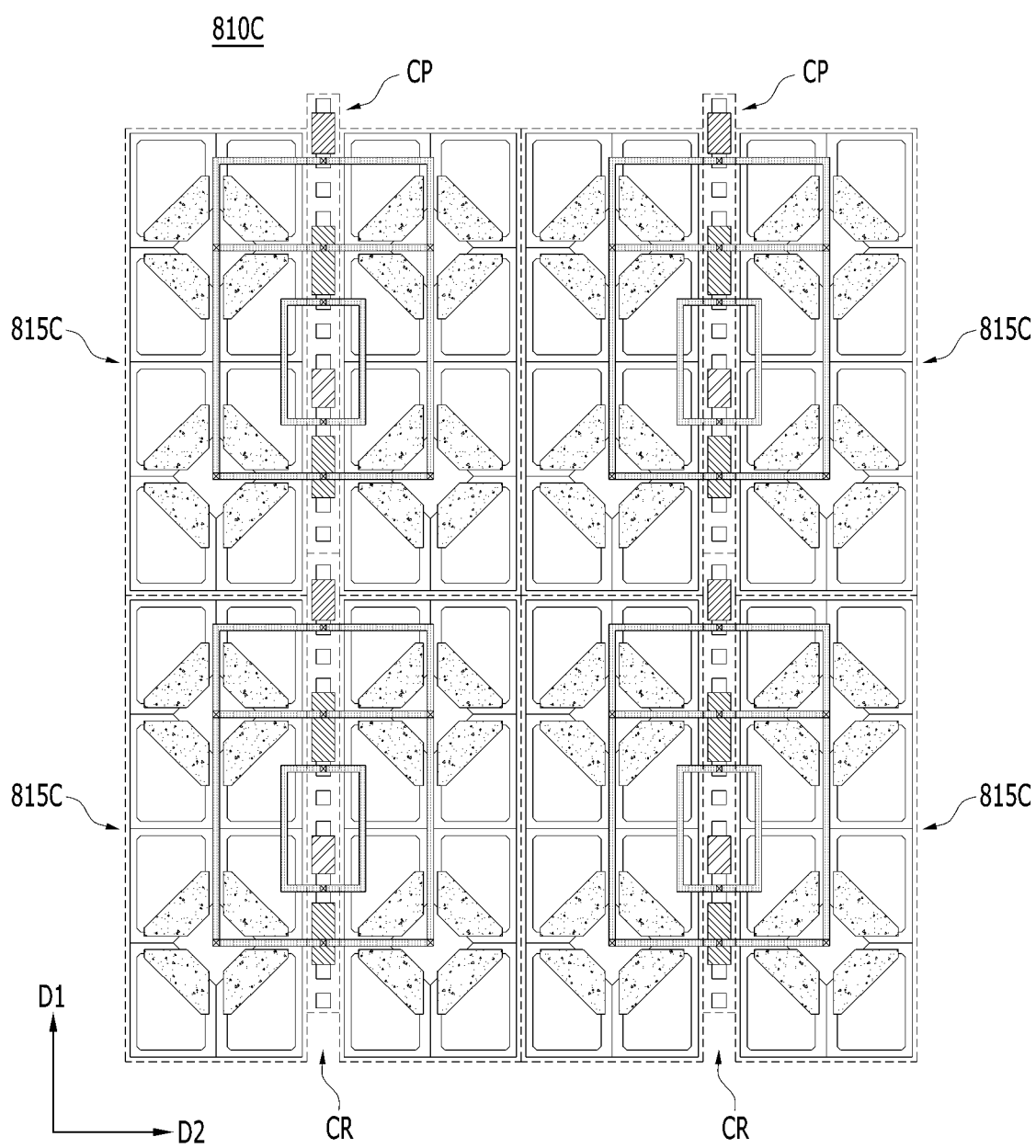
FIG. 9 is a layout diagram schematically illustrating an example of the pixel array of the image sensor based on some embodiments of the disclosed technology.

FIG. 9 is a layout diagram schematically illustrating an example of a pixel array 810C of the image sensor 800 based on some embodiments of the disclosed technology. Referring to FIG. 9, the pixel array 810C may include a plurality of unit pixel blocks 815C which are arranged side by side in the first direction D1 and the second direction D2. As shown in FIG. 8A, the unit pixel blocks 815C may be arranged such that projecting portions CP and recessed portions CR are engaged with each other. Each of the projecting portions CP may include a portion where the common reset transistor RX is formed in the common transistor block 50, and each of the recessed portions CR may be located outside the second drive transistor DX2 formed in the common transistor block 50.

Figure 10:
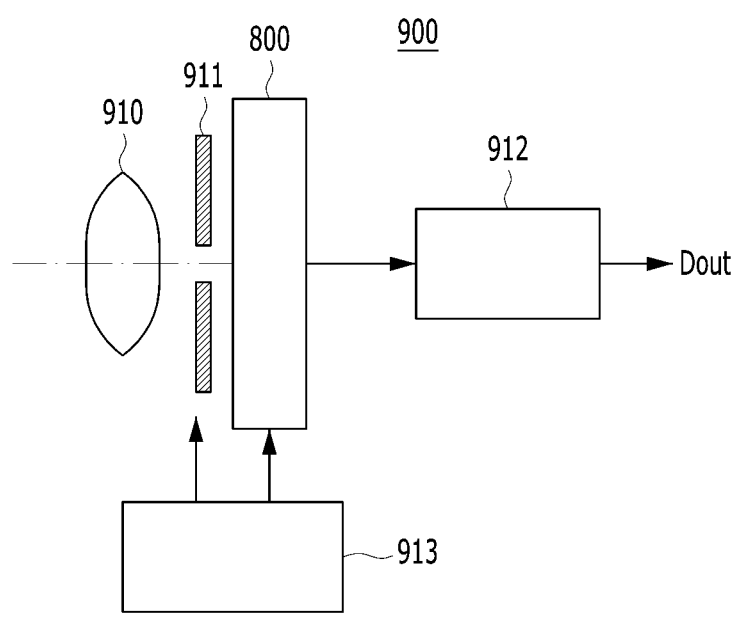
FIG. 10 is a diagram schematically illustrating an example of an electronic device including an image sensor implemented based on various embodiments of the disclosed technology.

FIG. 10 is a diagram schematically illustrating an example of an electronic device 900 including an image sensor 800 implemented based on various embodiments of the disclosed technology. Referring to FIG. 10, the electronic device 900 including the image sensor 800 implemented based on various embodiments of the disclosed technology may include a camera capable of taking still images and/or moving images. The electronic device 900 may include an optical system (e.g., an optical lens) 910, a shutter unit 911, a driving circuit 913 which controls/drives the image sensor 800 and the shutter unit 911, and a signal processing circuit 912. The image sensor 800 may be the image sensors implemented based on various embodiments of the disclosed technology.

The optical system 910 may guide image light (incident light) from an object, to a pixel array (see the reference numeral 810 of FIG. 1) of the image sensor 800. The optical system 910 may include a plurality of optical lenses. The shutter unit 911 may control a light irradiation period and a light shielding period with respect to the image sensor 800. The driving circuit 913 may control the transmission operation of the image sensor 800 and the shutter operation of the shutter unit 911. The signal processing unit 912 performs various kinds of signal processing for the signal outputted from the image sensor 800. An image signal Dout after signal processing may be stored in a storage medium such as a memory or may be outputted to a monitor or the like.

Although various embodiments have been described for illustrative purposes, it will be apparent to those skilled in the art that various changes and modifications may be made without departing from the spirit and scope of the invention as defined in the following claims.

What is claimed is:

1. An image sensor comprising:
unit pixel blocks with each having pixels for sensing incident light, each unit pixel block including:
a first sub pixel block including a first floating diffusion;
a second sub pixel block including a second floating diffusion; and
a common transistor block including a first drive transistor adjacent to the first floating diffusion, a second drive transistor adjacent to the second floating diffusion, and a selection transistor,
wherein the first and second floating diffusions are electrically coupled in common to the first and second drive transistors,
wherein the first floating diffusion and the second floating diffusion are electrically connected with each other through a first direct interconnection between the first floating diffusion and the second floating diffusion, and
wherein the selection transistor is coupled in common to the first and second drive transistors.

2. The image sensor according to claim 1,
wherein the first sub pixel block further includes first photodiodes and first transfer transistors, which are disposed in a matrix form,
wherein the first floating diffusion is disposed between the first photodiodes and the first transfer transistors,
wherein the second sub pixel block further includes second photodiodes and second transfer transistors, which are disposed in a matrix form, and
wherein the second floating diffusion is disposed between the second photodiodes and the second transfer transistors.

3. The image sensor according to claim 1,
wherein the unit pixel block further includes a second direct interconnection and a third direct interconnection electrically connecting the first and second floating diffusions to gate electrodes of the first and second drive transistors, respectively, and
wherein a length of a path of the second direct interconnection coupling the first floating diffusion to the first drive transistor is similar or identical to a length of a path of the third direct interconnection coupling the second floating diffusion to the second drive transistor.

4. The image sensor according to claim 3,
wherein the first sub pixel block and the second sub pixel block are symmetrical about a line between the first sub pixel block and the second sub pixel block, and
wherein the first drive transistor and the second drive transistor are symmetrical about a line between the first drive transistor and the second drive transistor.

5. The image sensor according to claim 1,
wherein the first and second drive transistors are coupled in parallel, and
wherein the first and second drive transistors and the selection transistor are coupled in series.

6. The image sensor according to claim 1,
wherein the common transistor block further includes an electrical isolation region which is disposed between the selection transistor and the first drive transistor, and
wherein the electrical isolation region includes an active region to which a ground voltage is applied.

7. The image sensor according to claim 1,
wherein the common transistor block further includes a reset transistor, and
wherein the reset transistor is coupled in common to the first floating diffusion and the second floating diffusion.

8. The image sensor according to claim 1,
wherein the unit pixel block is arranged in a side-by-side shape in a first direction, and is arranged in a zigzag style in a second direction perpendicular to the first direction.

9. The image sensor according to claim 1,
wherein the common transistor block includes a first common transistor block, which is disposed adjacent to first sides of the first sub pixel block and the second sub pixel block, and a second common transistor block, which is disposed adjacent to second sides of the first sub pixel block and the second sub pixel block, and
wherein the first sides and the second sides face away from each other.

10. The image sensor according to claim 9,
wherein the first common transistor block includes the first drive transistor, the second drive transistor, and the selection transistor between the first drive transistor and the second drive transistor.

11. The image sensor according to claim 9,
wherein the second common transistor block includes a reset transistor electrically coupled to the first floating diffusion and the second floating diffusion.

12. The image sensor according to claim 1,
wherein the unit pixel block further includes a third sub pixel block including a third floating diffusion and a fourth sub pixel block including a fourth floating diffusion, and
wherein the third floating diffusion is electrically coupled to the first drive transistor, and the fourth floating diffusion is electrically coupled to the second drive transistor.

13. The image sensor according to claim 12,
wherein the first sub pixel block and the second sub pixel block are adjacent to a first side of the common transistor block, and
wherein the third sub pixel block and the fourth sub pixel block are adjacent to a second side of the common transistor block.

14. An image sensor comprising an array of pixel blocks that are responsive to incident light, each pixel block including:
a first sub pixel block including a first floating diffusion;
a second sub pixel block including a second floating diffusion; and
a common transistor block including:
a first drive transistor and a second drive transistor coupled in common to the first floating diffusion and the second floating diffusion;
a selection transistor coupled in common to the first drive transistor and the second drive transistor; and
a reset transistor coupled in common to the first floating diffusion and the second floating diffusion,
wherein the first sub pixel block and the second sub pixel block are disposed to be adjacent to each other in a first direction,
wherein the common transistor block is disposed along one side of the first sub pixel block and one side of the second sub pixel block in a second direction,
wherein the first direction and the second direction are perpendicular to each other,
wherein the first floating diffusion and the second floating diffusion are electrically connected with each other through a direct interconnection between the first floating diffusion and the second floating diffusion, and wherein the first drive transistor, the second drive transistor, the selection transistor, and the reset transistor are disposed on a virtual line extending in the first direction.

15. The image sensor according to claim 14,
wherein the first sub pixel block further includes first photodiodes and first transfer transistors, which are disposed in a matrix form, and
wherein the second sub pixel block further includes second photodiodes and four second transfer transistors, which are disposed in a matrix form.

16. The image sensor according to claim 14,
wherein the first drive transistor and the second drive transistor are symmetrical about a line between the first drive transistor and the second drive transistor.

17. The image sensor according to claim 14,
wherein both a gate electrode of the first drive transistor and a gate electrode of the second drive transistor are coupled to both the first and second floating diffusions,
wherein a drain electrode of the first drive transistor and a drain electrode of the second drive transistor are coupled to a supply voltage node, and
wherein a source electrode of the first drive transistor and a source electrode of the second drive transistor are coupled in common to a drain electrode of the selection transistor.

18. The image sensor according to claim 17,
wherein the first drive transistor and the second drive transistor are coupled in parallel between the supply voltage node and the drain electrode of the selection transistor.

19. An image sensor comprising unit pixel blocks, each unit pixel block comprising:
a first sub pixel block including first photodiodes, first transfer transistors coupled to the first photodiodes, respectively, and a first floating diffusion coupled to the first transfer transistors to receive electrical charges or signals from the first photodiodes;
a second sub pixel block including second photodiodes, second transfer transistors coupled to the first photodiodes, respectively, and a second floating diffusion coupled to the second transfer transistors to receive electrical charges or signals from the second photodiodes; and
a common transistor block including a first drive transistor, a second drive transistor, and a selection transistor,
wherein the first floating diffusion of the first sub pixel block and the second floating diffusion of the second sub pixel block are coupled in common to a first drive transistor of and a second drive transistor in the common transistor block,
wherein:
the first floating diffusion and the second floating diffusion are electrically connected with each other through a direct interconnection between the first floating diffusion and the second floating diffusion,
a drain electrode of the selection transistor is directly electrically connected in common to source electrodes of the first drive transistor and the second drive transistor,
the first sub pixel block and the second sub pixel block are disposed to be adjacent to each other in a first direction,
the common transistor block is disposed along one side of the first sub pixel block and one side of the second sub pixel block in a second direction,
the first direction and the second direction are perpendicular to each other, and
the first drive transistor, the second drive transistor, and the selection transistor are on a virtual line extending in the first direction.

20. The image sensor according to claim 19, wherein:
the first floating diffusion is electrically connected to both a first gate electrode of the first drive transistor and a second gate electrode of the second drive transistor, and
the second floating diffusion is electrically connected to both the first gate electrode of the first drive transistor and the second gate electrode of the second drive transistor.

21. The image sensor according to claim 1, wherein:
the first sub pixel block and the second sub pixel block are disposed to be adjacent to each other in a first direction,
the common transistor block is disposed along one side of the first sub pixel block and one side of the second sub pixel block in a second direction, and
the first direction and the second direction are perpendicular to each other.

* * * * *